United States Patent [19]

Yokoyama et al.

[11] Patent Number: 4,967,393
[45] Date of Patent: Oct. 30, 1990

[54] FLASH ERASABLE AND PROGRAMMABLE NONVOLATILE SEMICONDUCTOR MEMORY

[75] Inventors: Sadayuki Yokoyama, Kawasaki; Kaoru Nakagawa, Yokohama, both of Japan

[73] Assignee: Kabushiki Kaisha Toshiba, Kawasaki, Japan

[21] Appl. No.: 462,346

[22] Filed: Jan. 3, 1990

Related U.S. Application Data

[63] Continuation of Ser. No. 154,065, Feb. 9, 1988, abandoned.

[30] Foreign Application Priority Data

Feb. 20, 1987 [JP] Japan .................................. 62-37072

[51] Int. Cl.[5] .............................................. G11C 11/34
[52] U.S. Cl. .................................. 365/185; 365/218; 357/23.5
[58] Field of Search ................... 365/185, 218, 51, 63; 357/41, 23.5

[56] References Cited

U.S. PATENT DOCUMENTS

| | | | |
|---|---|---|---|
| 4,437,172 | 3/1984 | Masuoka | 365/182 |
| 4,437,174 | 3/1984 | Masuoka | 365/218 |
| 4,442,092 | 12/1983 | Guterman | 357/23.5 X |
| 4,466,081 | 8/1984 | Masuoka | 365/218 |
| 4,561,004 | 12/1985 | Kuo et al. | 357/23.5 |
| 4,803,529 | 2/1989 | Masuoka | 357/23.5 |

Primary Examiner—Stuart N. Hecker
Assistant Examiner—Andrew L. Sniezek
Attorney, Agent, or Firm—Finnegan, Henderson, Farabow, Garrett and Dunner

[57] ABSTRACT

In a nonvolatile semiconductor memory, each of a plurality of memory cells arranged in the form of a matrix includes a p-type semiconductor region, an n-type source connected to the ground potential, an n-type drain formed in a longitudinal direction with respect to the source, a channel region located between the source and the drain, a control gate transversely extending and formed above the channel region, intervening a first insulating film, a floating gate formed in the first insulating film above the channel region, and an erase gate formed in the first insulating film so as to spatially overlap one end of the floating gate. The memory further includes an erase line extending in the longitudinal direction, formed in the first insulating film and connected to the erase gate, and a data line, connected to the drain. First and second memory cells of the plurality of memory cells are arranged to be adjacent to one another in the transverse direction to constitute a first memory cell pair. The sources of the first and second memory cells are exclusively connected to one another. The sources of the adjacent memory cell series in the transverse direction are independently formed. The erase gate line connected to the erase gate and the source do not cross over each other.

15 Claims, 7 Drawing Sheets

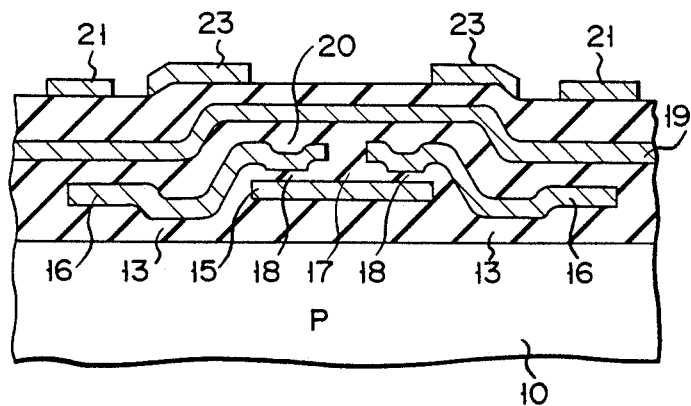
F I G. 5A
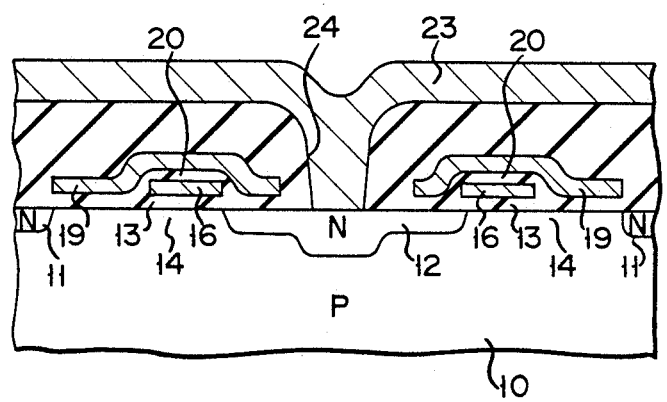
F I G. 5B
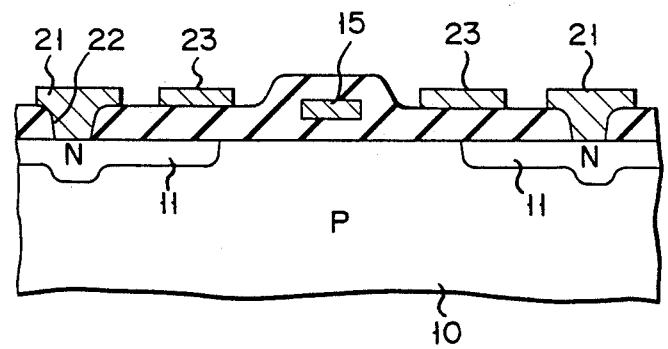
F I G. 5C

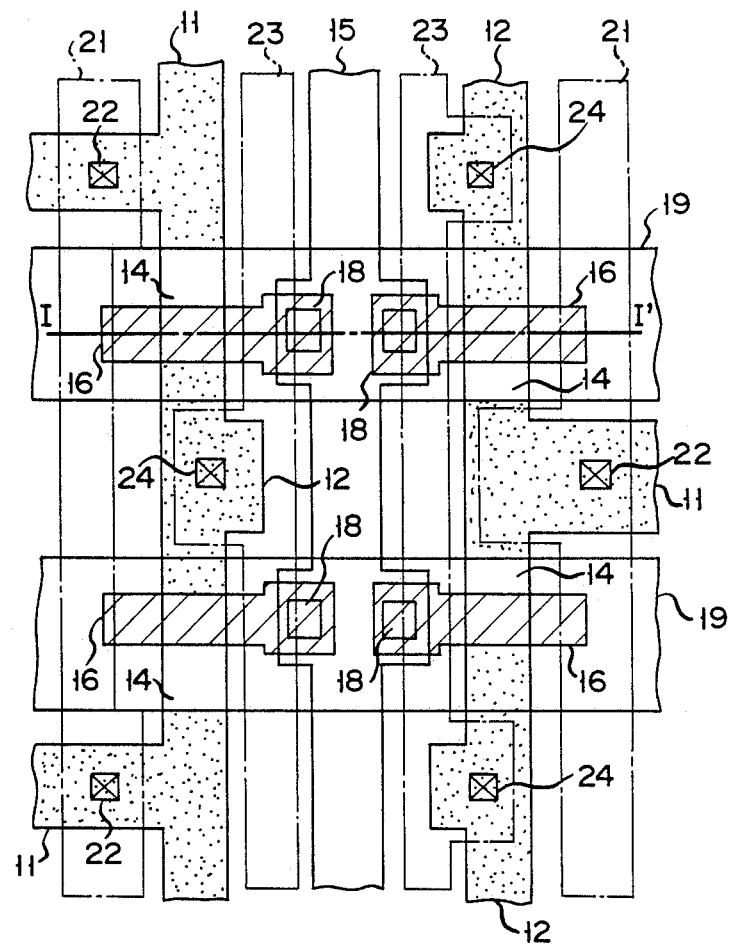
F I G. 6
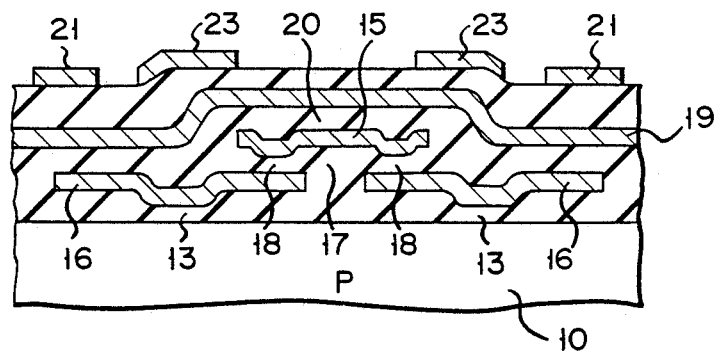
F I G. 7

FLASH ERASABLE AND PROGRAMMABLE NONVOLATILE SEMICONDUCTOR MEMORY

This application is a continuation of application Ser. No. 154,065, filed 02/09/88 now abandoned.

BACKGROUND OF THE INVENTION

1. Field of the Invention

The present invention relates to a nonvolatile semiconductor memory capable of electrically erasing data.

2. Description of the related art including information disclosed under §§1.97-1.99

EP-ROMs (Erasable Programmable-ROMs) allow data to be written and erased after they are fabricated. EP-ROMs can be roughly categorized into two types, i.e., an ultraviolet-erasable type and an electrically erasable type.

In an ultraviolet-erasable P-ROM, a single memory cell can be constituted by a single transistor. Therefore, a high packing density can be achieved. Currently, 32- and 64-Kbit EP-ROMs have been developed. However, such an ultraviolet-erasable P-ROM must be formed by a package having a window for transmitting ultraviolet rays, resulting in an increase in the manufacturing cost.

On the other hand, an electrically erasable P-ROM, which is specifically called an $E^2$P-ROM (Electrically Erasable Programmable-ROM), can be formed by an inexpensive package having no window, thereby decreasing the manufacturing cost. However, since at least two transistors are required to constitute a single memory cell, a high packing density cannot be achieved. For this reason, an $E^2$P-ROM having a density of only 16 Kbits has been proposed so far.

Thus, an $E^2$P-ROM which can solve both the problems of density and manufacturing cost has been developed. FIG. 1 shows such a ROM. In this ROM, a plurality of memory cells are arranged in the form of a matrix in the transverse and longitudinal directions in the drawing. FIG. 1 shows only four memory cells. Each of four memory cells 30A to 30D consists of a nonvolatile transistor having drain region D, source region S, floating gate electrode FG, erase gate electrode EG, and control gate electrode CG. Drain regions D of upper two memory cells 30A and 30B, and of lower two memory cells 30C and 30D, both pairs of which are adjacent to each other in the transverse direction, are connected to data lines 31A and 31B, respectively. Control gate electrodes CG of two memory cells 30A and 30C on the left side, and of two memory cells 30B and 30D on the right side, both pairs of which are adjacent to each other in the longitudinal direction, are commonly connected to control gate lines 32A and 32B, respectively. Source regions S of four memory cells 30A to 30D, and erase gate electrodes EG thereof are commonly connected to ground and erase gate lines 33 and 34, respectively.

In such a memory, data programming and erase operations are performed as follows. In the programming operation, for example, data line 31A, to which selected memory cell 30A is connected, and control gate line 32A are set at a high voltage, while erase gate line 34 is set at the ground voltage. Consequently, a large channel current flows through selected memory cell 30A and hot electrons are generated near its drain. The hot electrons are attracted to control gate electrode CG set at the high voltage. Then, the hot electrons surpass an insulating film formed between channel and floating gate electrode FG, and flow into floating gate electrode FG. As a result, threshold voltage $V_{TH}$ of a channel under floating gate electrode FG is increased up to about a voltage between +10 V and +20 V. For this reason, even if a voltage of +5 V is applied to control gate electrode CG when data is read out, memory cell 30A is kept in the OFF state. This state is called a programmed state.

In the erase operation, erase gate line 34 is set at a high voltage, while data line 31A, to which selected memory cell 30A is connected, and control gate line 32A are set at the ground voltage. Consequently, electrons are discharged from floating gate electrode FG of selected memory cell 30A toward erase gate electrode EG. Threshold voltage $V_{TH}$ of a channel under floating gate electrode FG of memory cell 30A, from which the electrons have been discharged, is decreased to a few volts. As a result, when a voltage of +5 V is applied to control gate electrode CG when data is read out, memory cell 30A, from which data is erased, is set in the ON state. This state is called an erased state.

FIG. 2 is a plan view showing a pattern of a conventional element structure when the memory in FIG. 1 is formed into an integrated circuit. FIGS. 3A to 3C are sectional views taken along lines I—I', II—II', and III—III' of FIG. 2, respectively. Memory cell 30A will be exemplified below.

Referring to FIGS. 3A to 3C, memory cell 30A comprises p-type semiconductor substrate 10, n-type diffusion region 11 to be formed into a common source region of memory cell 30C, n-type diffusion region 12 to be formed into a common drain region of memory cell 30B, gate insulating film 13A having a thickness of about 500 Å, and channel regions 14A.

First polysilicon layer 15 constitutes erase gate electrode EG and erase gate line 34 of memory cell 30A. Second polysilicon layer 16 constitutes floating gate electrode FG. Third polysilicon layer 19 constitutes control gate electrode CG and control gate line 32A. Aluminum wiring layer 21 serves to apply the ground voltage to n-type diffusion region 11 to be formed into the source region of memory cell 30A. Contact hole 22 connects aluminum wiring layer 21 to n-type diffusion region 11. Each aluminum wiring layer 23 is connected to corresponding n-type diffusion region 12 to be formed into the drain region of memory cell 30A and serves as data line 31A. Contact holes 24 connect aluminum wiring layers 23 to n-type diffusion regions 12. Insulating film 17 having a thickness of about 300 Å is formed between erase gate line 34 composed of first polysilicon layer 15 and floating gate electrode FG composed of second polysilicon layer 16.

In the conventional memory cell with the above structure, as is apparent from the sectional view of FIG. 3C, n-type diffusion region 11 constituting source region S and ground line 33 and first polysilicon layer 15 constituting erase gate electrode EG and erase gate line 34 spatially cross each other on the substrate. As described above, a high voltage is applied to first polysilicon layer 15 (erase gate line 34) when data is to be erased. For this reason, an insulating film present at a region where polysilicon layer 15 and n-type diffusion region 11 spatially cross each other must have a thickness of 1,000 to 2,000 Å to prevent dielectric breakdown. Therefore, a 1,000 to 2,000 Å-thick insulating film must be formed only in this region in advance, and an insulating film having a thickness of sufficiently less than 1,000 Å is formed in the subsequent process, thereby complicating the processes.

In addition, since n-type diffusion region 11 and polysilicon layer 15 spatially cross each other, part of n-type diffusion region 11 must be formed prior to the formation of polysilicon layer 15 in this cross region. After polysilicon layer 15 is formed, n-type diffusion region 11 must be formed integrally with the preformed part of n-type diffusion region, thereby complicating the processes.

Moreover, in the conventional memory, since n-type diffusion regions 11 for source regions and aluminum wiring layer 21 for applying the ground voltage are connected to each other through contact holes 22 formed every few memory cell bits, the source resistance of a memory cell located far from contact hole 22 is increased. Therefore, a channel current in the read operation is decreased, resulting in a decrease in read speed of data.

SUMMARY OF THE INVENTION

The present invention has been made in consideration of the above situation, and has as its object to provide a nonvolatile semiconductor memory, in which a decrease in read speed of data can be prevented without complicating the manufacturing processes.

A nonvolatile semiconductor memory according to the present invention comprises:

a plurality of memory cells arranged in the form of a matrix, each of the memory cells including a semiconductor region of, for example, a p-type;

an n-type source electrode formed on the semiconductor region and connected to a ground potential;

an n-type drain electrode formed on the semiconductor region in a first direction with respect to the source electrode, e.g., a longitudinal direction, a region between the source and drain electrodes constituting a channel region;

a control gate electrode transversely extending and formed on the semiconductor region so as to cover the channel region and sandwich a first insulating film, part of the control gate electrode spatially overlapping the drain electrode;

a floating gate electrode formed in the first insulating film over the channel region;

an erase gate electrode formed in the first insulating film so as to spatially overlap one end of the floating gate electrode;

an erase line longitudinally extending, formed in the first insulating film, and connected to the erase gate electrode; and a data line, connected to the drain electrode, for reading out data stored in the memory cell.

First and second memory cells of the plurality of memory cells are arranged to be adjacent to each other in the transverse direction to constitute a first memory cell pair. The source electrodes of the first and second memory cells are connected to each other.

That is, in the nonvolatile semiconductor memory according to the present invention, source electrodes of the adjacent memory cell pairs in the transverse direction are independently formed. Therefore, the erase gate line connected to the erase gate electrode and the source electrode do not cross each other.

In addition, by connecting a ground line to each of the source electrodes of the memory cell pairs, the source region of each memory cell can be connected to a ground wiring layer at the minimum distance.

As described above, according to the present invention, there is provided a nonvolatile semiconductor memory, in which a decrease in read speed of data can be prevented without complicating the manufacturing processes.

BRIEF DESCRIPTION OF THE DRAWINGS

FIGS. 5A to 5C are sectional views of the memory in FIG. 4 taken along the lines I—I', II—II', and III—III' thereof;

FIG. 6 is a plan view showing a pattern of a first modification of the memory according to an embodiment of the present invention;

FIG. 7 is a sectional view of the memory in FIG. 6 taken along the line I—I' thereof;

DETAILED DESCRIPTION OF THE PREFERRED EMBODIMENT

A nonvolatile semiconductor memory according to an embodiment of the present invention will now be described in detail with reference to the accompanying drawings.

Figure 4:
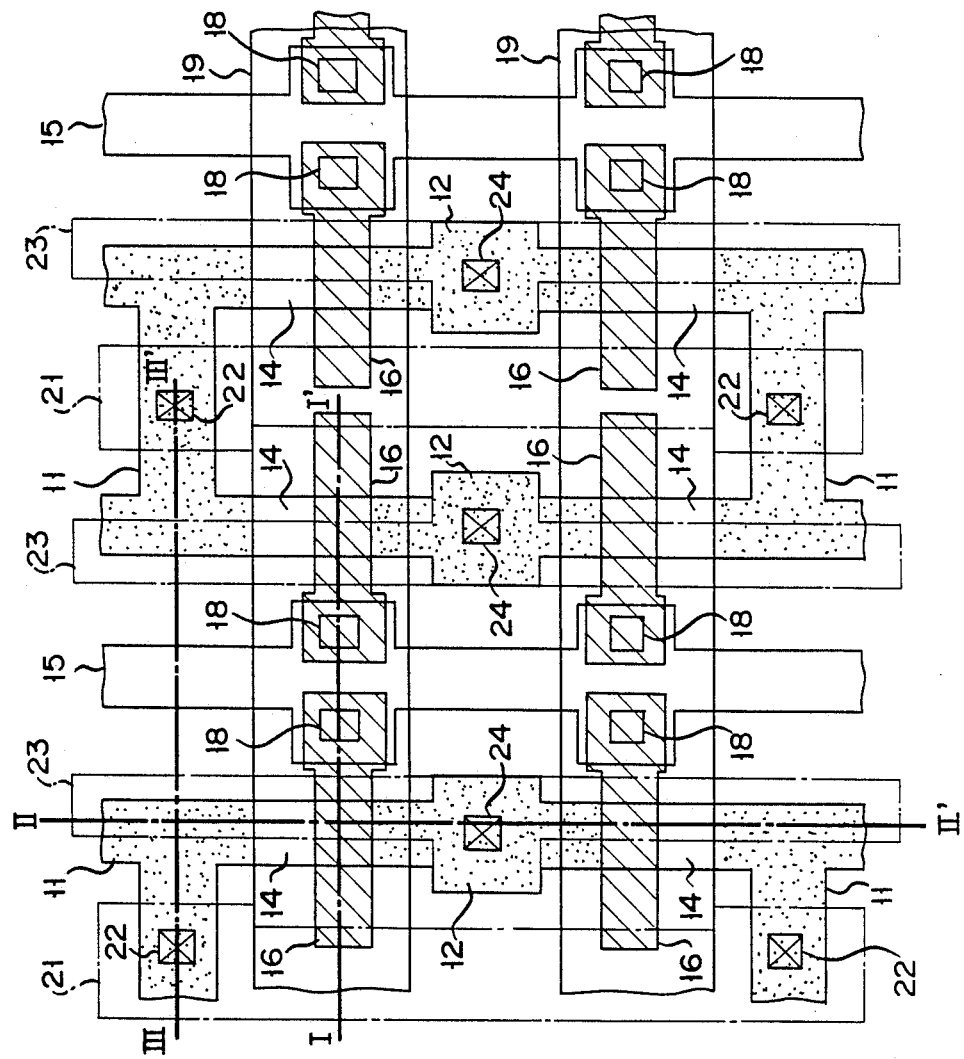
FIG. 4 is a plan view showing a pattern of a memory according to an embodiment of the present invention.

FIG. 4 is a plan view showing a pattern of a nonvolatile semiconductor memory according to an embodiment of the present invention. FIGS. 5A to 5C are sectional views taken along lines I—I', II—II', and III—III' in FIG. 4.

The nonvolatile semiconductor memory according to this embodiment is constituted by p-type semiconductor substrate 10. N-type diffusion regions 11 for source regions are independently formed every two memory cells adjacent to each other in the transverse direction in FIG. 4. N-type diffusion regions 12 are formed into common drain regions of each pair of two memory cells adjacent to one another in the longitudinal direction in FIG. 4. Gate insulating film 13 having a thickness of about 500 Å is formed between n-type diffusion regions 11 and 12. A surface of substrate 10 under each gate insulating film 13 becomes channel region 14 of each memory cell. In FIG. 4, first polysilicon layer 15 constitutes an erase gate electrode and an erase gate line of each memory cell. Polysilicon layer 15 is spatially arranged between respective n-type diffusion regions 11 and extends in the longitudinal direction.

Each second polysilicon layer 16 constitutes a floating gate electrode of each memory cell and is formed on channel region 14 between n-type diffusion regions 11 and 12 of each memory cell through gate insulating film 13. One end of polysilicon layer 16 is spatially overlaid with polysilicon layer 15. Insulating film 17 is formed on polysilicon layer 15. Thin film portion 18 having a thickness of about 300 Å is formed at a central portion of insulating film 17 where polysilicon layers 15 and 16 spatially overlay one another, while the thickness of other parts of insulating film 17 are set to be about 500 Å.

In FIG. 4, each third polysilicon layer 19 is continuously formed over respective channel regions 14 of a plurality of memory cells adjacent to one another in the transverse direction, thereby constituting a control gate electrode and a control gate line of each memory cell. Polysilicon layer 19 covers corresponding second polysilicon layer 16, intervening corresponding insulating film 20, while part of it directly covers channel region 14 intervening corresponding gate insulating film 13. In FIG. 4, each aluminum wiring layer 21 extends in the longitudinal direction and serves to apply the ground voltage to corresponding n-type diffusion regions 11. Each n-type diffusion region 11 is connected to a corresponding region of aluminum wiring layers 21 through corresponding contact hole 22. Each aluminum wiring layer 23 in FIG. 4 serves as a data line extending in the longitudinal direction. Each n-type diffusion region 12 and a corresponding region of aluminum wiring layers 23 are connected through corresponding contact hole 24.

Figure 1:
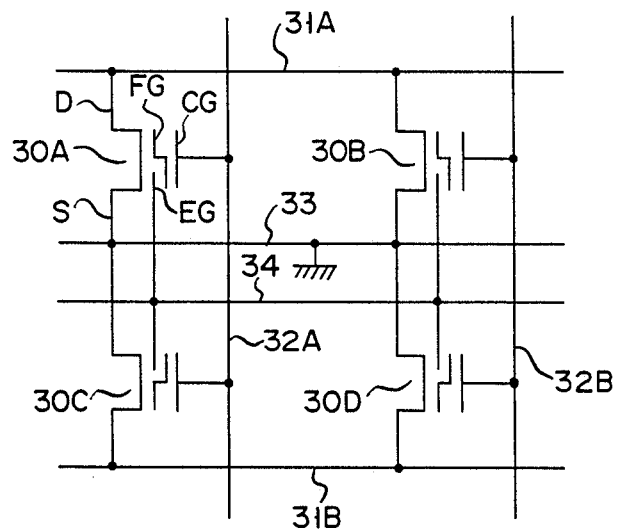
FIG. 1 is a circuit diagram of a conventional $E^2P$-ROM.
Figure 2:
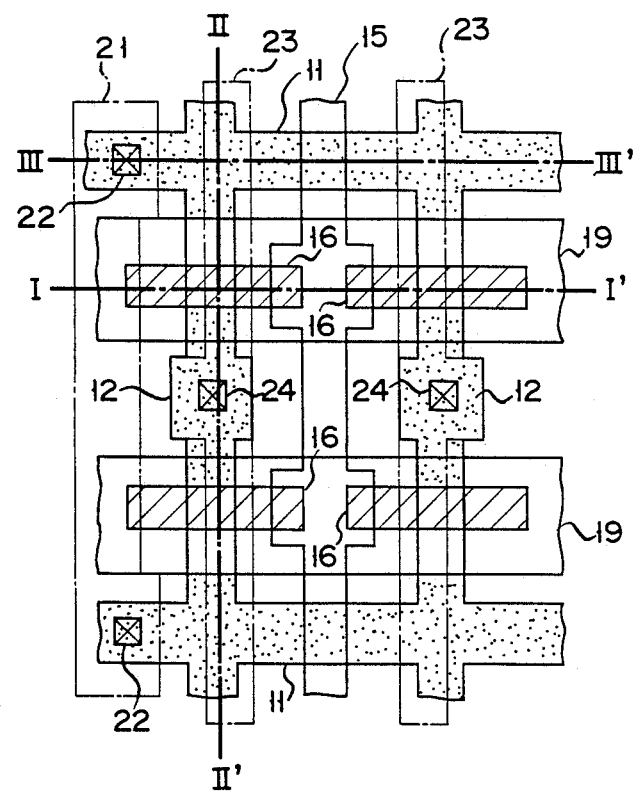
FIG. 2 is a plan view showing a pattern of a conventional element structure when the memory in FIG. 1 is formed into an integrated circuit.
Figure 3A:
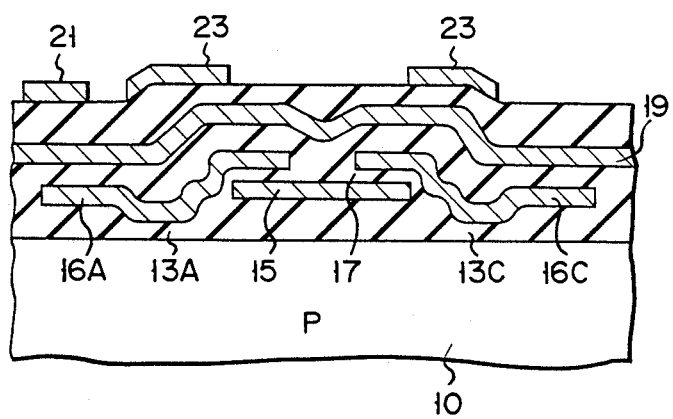
FIGS. 3A to 3C are sectional views of the memory in FIG. 2 taken along the lines I—I', II—II', and III—III' thereof.
Figure 3B:
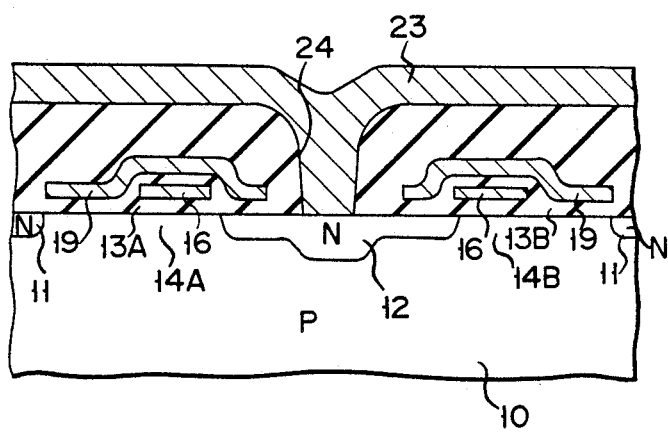
Figure 3C:
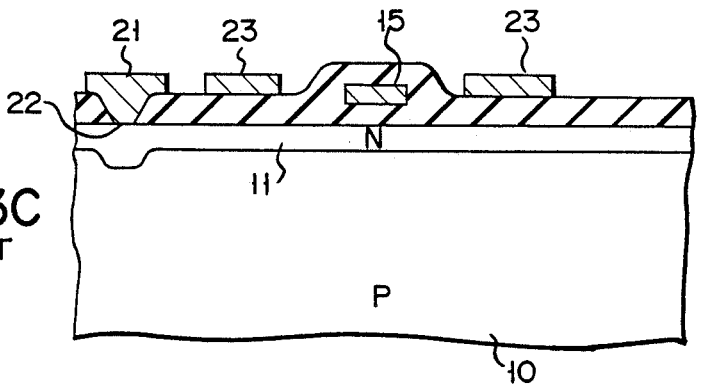

An equivalent memory circuit with a similar arrangement is shown in FIG. 1. In FIG. 4, three memory cells and two memory cells are respectively shown in the transverse and longitudinal directions. In each memory cell, source and drain regions S and D are constituted by n-type diffusion regions 11 and 12, and erase gate electrode EG and erase gate line 34 are constituted by polysilicon layer 15. Floating gate electrode FG is constituted by polysilicon layer 16, and control gate electrode CG and control gate line 32 are constituted by polysilicon layer 19. Ground and data lines 33 and 31 are respectively constituted by aluminum wiring layers 21 and 23.

The programming and erase operations of the memory have a similar arrangement to those of the conventional memory. More specifically, a programming operation is performed by setting a data line, to which a selected memory cell is connected, and a control gate line at a high voltage, while setting an erase gate line at the ground voltage. An erase operation is performed by setting an erase gate line at a high voltage, while setting a data line, to which a selected memory cell is connected, and control gate line at the ground voltage.

In the memory having such an arrangement, as is apparent from the sectional view of FIG. 5C, n-type diffusion region 11 constituting source region S of a memory cell and first polysilicon layer 15 constituting erase gate electrode EG and erase gate line do not spatially cross each other. For this reason, the problem of dielectric breakdown between polysilicon layer 15 and n-type diffusion region 11 upon application of a high voltage in the data erase mode in the conventional memory can be solved. Therefore, in FIG. 5C, the thickness of the insulating film formed between polysilicon layer 15 and substrate 10 can be reduced to sufficiently less than 1,000 Å as in other regions. Since such an insulating film can be formed in a single PEP, the manufacturing processes can be simplified compared with those of the conventional memory.

In addition, since n-type diffusion region 11 and polysilicon layer 15 do not spatially cross each other at all, n-type diffusion regions 11 can be formed in a single PEP. Therefore, the manufacturing processes can be further simplified compared with those of the conventional memory.

In the memory according to the above embodiment, each aluminum wiring layer 21 for applying the ground voltage is connected to each n-type diffusion region 11 for a common source region formed every two memory cells through a corresponding one of contact holes 22. With this arrangement, distances from source regions of the respective memory cells to corresponding aluminum wiring layers 21 are equalized and minimized, thereby minimizing the source resistance of each memory cell. As a result, a channel current for reading out data from a memory cell can be increased so that a decrease in read speed of data can be prevented.

In addition, in the memory of this embodiment, only a part of insulating film 17, which is present between second polysilicon layer 16 to be formed into a floating gate electrode and first polysilicon layer 15 to be formed into erase gate electrode and at a region where they are overlaid with each other, has a thickness of about 300 Å to constitute thin film portion 18. In the conventional memory, however, the entire part of insulating film 17 present in the region where layers 15 and 16 are overlaid with each other is formed into a thin film portion. Accordingly, the area of the thin film portion is increased, so that the ratio of a capacitance generated between floating gate electrode FG and control gate electrode CG to that between erase gate electrode EG and floating gate electrode FG is increased. As a result, in the data programming operation, even if a high voltage is applied to control gate electrode CG, the voltage of floating gate electrode FG is not sufficiently raised, and programming cannot be sufficiently performed.

However, in the memory of this embodiment, only a part of insulating film 17 present between polysilicon layers 15 and 16 at the region where they are overlaid with each other constitutes thin film portion 18. The area of the thin film portion is sufficiently reduced compared with that of the conventional memory. As a result, the ratio of a capacitance generated between erase gate electrode EG and floating gate electrode FG to that between floating gate electrode FG and control gate electrode CG is decreased. The voltage of floating gate electrode FG in the data programming mode can be sufficiently increased. Therefore, in the memory of this embodiment, programming can be satisfactorily performed in the data programming operation.

FIG. 6 is a plan view showing a pattern of a first modification of the nonvolatile semiconductor memory according to the embodiment of FIG. 4. In the memory of this modification, n-type diffusion regions 11 and 12 for source and drain regions are alternately arranged around each channel region 14 for every two bits. Similarly, in this case, n-type diffusion regions 11 for source regions are independently arranged for every two memory cells. Each aluminum wiring layer 21 for applying the ground voltage is connected to each n-type diffusion region 11 through corresponding contact hole 22. Therefore, in the memory of this modification, the same effects as those in the memory of the embodiment in FIG. 4 can be obtained in terms of operation and manufacture. A packing density in this modification can be increased compared with that in the embodiment of FIG. 4.

FIG. 7 is a sectional view of the memory according to the modification in FIG. 6, which shows its pattern, taken along the line I—I' thereof. FIG. 7 corresponds to the sectional view in FIG. 5A. In the memory of this modification, erase gate electrode EG and an erase gate line, and floating gate electrode FG and a floating gate line are constituted by second and first polysilicon layers 15 and 16, respectively. The vertical relationship between polysilicon layers 15 and 16 is the only difference between the embodiment and the above modification. In this modification, the same effect as that in the embodiment of FIG. 4 can be obtained.

Figure 8:
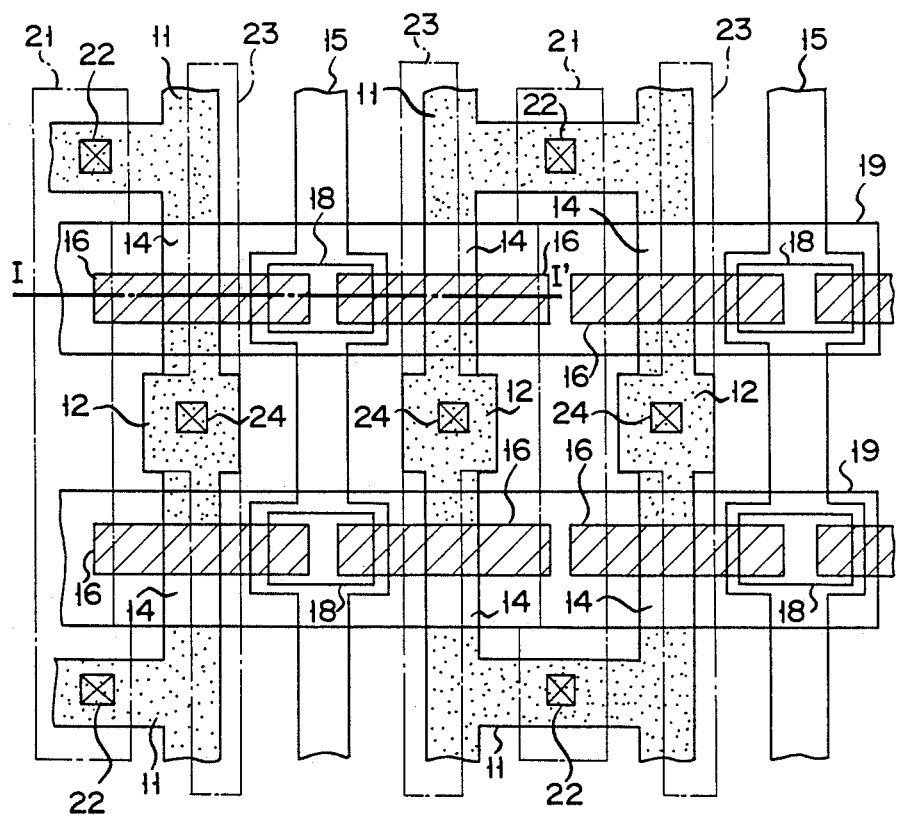
FIG. 8 is a plan view showing a pattern of a second modification of the memory according to the embodiment of the present invention.
Figure 9:
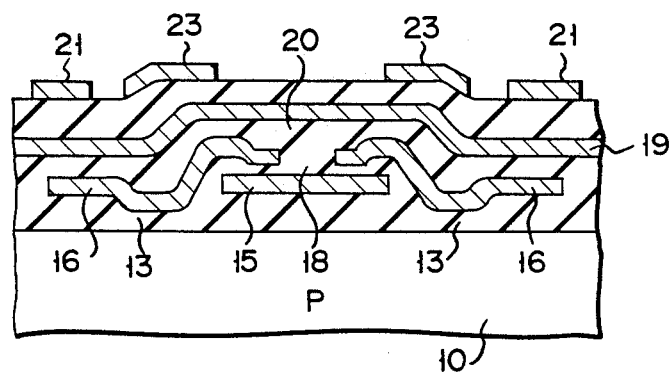
FIG. 9 is a sectional view of the memory in FIG. 8 taken along the line I—I' thereof.

FIG. 8 is a plan view showing a pattern of a nonvolatile semiconductor memory according to a second modification of the embodiment in FIG. 4. FIG. 9 is a sectional view taken along the line I—I' of FIG. 8. In the embodiment of FIG. 4, only the central portion of insulating film 17 in the region where polysilicon layers 15 and 16 are overlaid with each other is formed into thin film portion 18 having a thickness of about 300 Å. With this arrangement, the area of thin film portion 18 can be reduced, and the capacitance between floating gate electrode FG and erase gate electrode EG can be reduced.

In contrast to the above embodiment, in the memory of this modification, common thin film portion 18 is formed for every two memory cells sharing polysilicon layer 15 for an erase gate. Similarly, in this case, in order to reduce the area of a thin film portion of each memory cell, end portions of thin film 18 are located inward from end portions of polysilicon layer 15 serving as an erase gate electrode.

Figure 10:
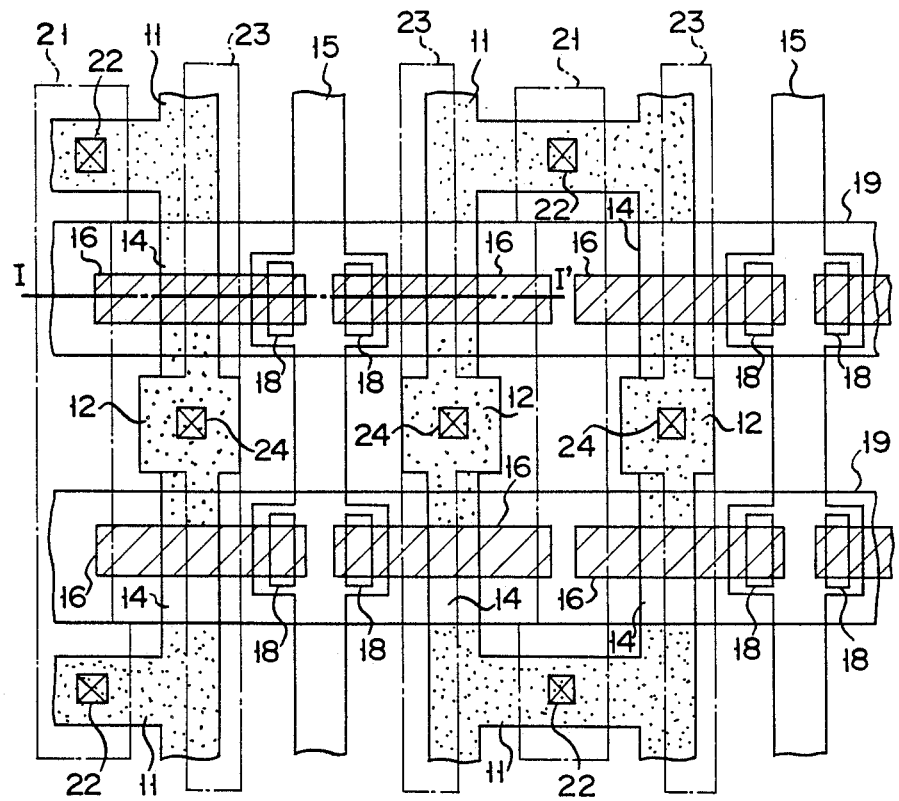
FIG. 10 is a plan view showing a pattern of a third modification of the memory according to the embodiment of the present invention.
Figure 11:
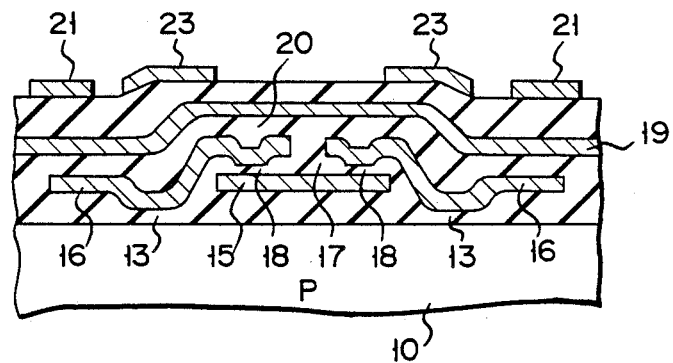
FIG. 11 is a sectional view of the memory in FIG. 10 taken along the line I—I' thereof.

FIG. 10 is a plan view showing a pattern of an arrangement of a nonvolatile semiconductor memory according to a third modification of the embodiment in FIG. 4. FIG. 11 is a sectional view taken along the line I—I' of FIG. 10. In the memory of this modification, in order to reduce the area of thin film portion 18 and the capacitance between floating gate electrode FG and erase gate electrode EG, thin film portion 18 is arranged at a central portion of region where layers 15 and 16 are spatially overlaid on each other. In addition, each thin film portion 18 is elongated so as to extend from second polysilicon layer 16 serving as floating gate electrode FG in its width direction. According to such an arrangement, even if a masking error is caused upon formation of thin film portion 18, a uniform erase characteristic can be obtained from each memory cell because the area of thin film portion 18 of each memory cell is constant.

The present invention is not limited to the embodiment and modifications described above, but various changes and modifications can be made. For example, in the memories according to the modifications in FIGS. 6, 8, and 10, first and second polysilicon layers 15 and 16 may be exchanged to constituted an erase gate electrode and a floating gate electrode.

What is claimed is:
1. A nonvolatile semiconductor memory comprising:
a semiconductor region of a first conductivity type; and
a plurality of memory cell groups, each having four memory cells, including:
a shared source conductive layer of a second conductivity type formed on said semiconductor region and connected to a first potential,
first, second, third and fourth drain conductive layers, of the second conductivity type, formed on said semiconductor region around said shared source conductive layer at equal distances from a center portion thereof, said first and second drain conductive layers being positioned in a first direction from said shared source conductive layer, said third and fourth drain conductive layers being positioned in a second direction, opposite to said first direction, from said shared source conductive layer, and regions between said shared source conductive layer and said first, second, third and fourth drain conductive layers constituting first, second third and fourth channel regions, respectively;
first and second control gate conductive layers, extending in a third direction substantially perpendicular to said first direction, formed above said semiconductor region such that said first control gate conductive layer covers said first and second channel regions and said second control gate conductive layer covers said third and fourth channel regions, with an insulating film being sandwiched between said first and second control gate conductive layers and their respective channel regions;
first, second third and fourth floating gate conductive layers respectively formed above said first, second, third and fourth channel regions in said insulating film,
first, second, third and fourth erase gate electrodes respectively formed in said insulating film such that portions of said first, second, third and fourth erase gate electrodes respectively overlap portions of said first, second, third and fourth floating gate conductive layers.
first and second erase gate lines extending parallel to each other, said first erase gate line being provided on one side of said four memory cells and said second erase gate line being provided on an opposite side of said four memory cells, each of said first and second erase gate lines being formed integrally with two of said first, second, third and fourth erase gate electrodes such that said first and second erase gate lines do not overlap said shared source conductive layer; and
a first data line connected to said first and second drain conductive layers and a second data line connected to said third and fourth drain conductive layers.

2. A memory according to claim 1, wherein said shared source conductive layer has a contact for connection to said first potential at said center portion thereof.

3. A memory according to claim 1, wherein first and second drain conductive layers of a first memory cell group correspond to third and fourth drain conductive layers of a second memory cell group.

4. A memory according to claim 1, wherein said first, second, third and fourth floating gate conductive layers and said first, second, third and fourth erase gate electrodes sandwich thin portions of said insulating film at said overlap portions.

5. A memory according to claim 4, wherein said thin portions of said insulating film are arranged substantially at the center of the corresponding overlap portions.

6. A memory according to claim 5, wherein said portions of said first, second, third and fourth floating gate conductive layers are formed above said portions of first, second, third and fourth erase gate electrodes, respectively.

7. A memory according to claim 5, wherein said portions of said first, second, third and fourth erase gate electrodes are formed above said portions of said first, second, third and fourth floating gate conductive layers, respectively.

8. A memory according to claim 4, wherein the width of said portions of said insulating film are larger than the width of said first, second, third and fourth floating gate conductive layers.

9. A memory according to claim 8, wherein said portions of said first, second, third and fourth floating gate conductive layers are formed above portions of said first, second, third and fourth erase gate electrodes, respectively.

10. A memory according to claim 8, wherein said portions of said first, second, third and fourth erase gate electrodes are formed above said portions of said first, second, third and fourth floating gate conductive layers, respectively.

11. A memory according to claim 4, wherein said thin portions of said insulating film are smaller than said overlap portions.

12. A memory according to claim 11, wherein said portions of said first, second, third and fourth floating gate conductive layers are formed above said portions of said first, second, third and fourth erase gate electrodes, respectively.

13. A memory according to claim 11, wherein said portions of said first, second, third and fourth erase gate electrodes are formed above said portions of said first, second, third and fourth floating gate conductive layers, respectively.

14. A memory according to claim 1, wherein one memory cell group is disposed adjacent to and offset from another memory cell group.

15. A memory according to claim 14, wherein said one memory cell group is offset by one memory cell from said another memory cell group.

* * * * *